United States Patent
Yu

(10) Patent No.: US 10,638,076 B2
(45) Date of Patent: Apr. 28, 2020

(54) SENSING APPARATUS

(71) Applicant: GenOptics Precision Biotechnologies Inc., New Taipei (TW)

(72) Inventor: Teng-Chien Yu, Hsinchu (TW)

(73) Assignee: GenOptics Precision Biotechnologies Inc., New Taipei (TW)

( * ) Notice: Subject to any disclaimer, the term of this patent is extended or adjusted under 35 U.S.C. 154(b) by 0 days.

(21) Appl. No.: 16/430,445

(22) Filed: Jun. 4, 2019

(65) Prior Publication Data

US 2020/0018700 A1   Jan. 16, 2020

Related U.S. Application Data

(60) Provisional application No. 62/696,322, filed on Jul. 10, 2018.

(51) Int. Cl.
| | |
|---|---|
| G01J 3/30 | (2006.01) |
| H04N 5/3745 | (2011.01) |
| H04N 5/353 | (2011.01) |
| H04N 5/378 | (2011.01) |
| H04B 10/116 | (2013.01) |
| H04L 7/00 | (2006.01) |

(Continued)

(52) U.S. Cl.
CPC ....... *H04N 5/37452* (2013.01); *G01N 21/554* (2013.01); *G01N 21/645* (2013.01); *G02B 5/22* (2013.01); *G02B 5/285* (2013.01); *H01L 31/1126* (2013.01); *H04B 10/116* (2013.01); *H04L 7/0075* (2013.01); *H04N 5/353* (2013.01); *H04N 5/3696* (2013.01); *H04N 5/378* (2013.01); *H04N 9/045* (2013.01); *G01N 2201/064* (2013.01)

(58) Field of Classification Search
CPC .... G01N 21/553; G01N 21/554; G01N 21/62; G01N 21/63; G01N 21/648; G01J 3/443; G01J 3/4406
See application file for complete search history.

(56) References Cited

U.S. PATENT DOCUMENTS

| | | | |
|---|---|---|---|
| 2003/0205681 A1* | 11/2003 | Modlin | G01N 21/6428 250/458.1 |
| 2008/0105831 A1* | 5/2008 | Reel | G01N 21/6428 250/458.1 |

(Continued)

*Primary Examiner* — Michael A Lyons
*Assistant Examiner* — Jonathon Cook
(74) *Attorney, Agent, or Firm* — JCIPRNET

(57) ABSTRACT

A sensing apparatus adapted to detect samples is provided. The sensing apparatus includes a light source, a light-penetrating medium, a metal thin film, and a plurality of sensors. The light source is adapted to provide a light beam. The light-penetrating medium has an optical surface. The metal thin film is disposed on the optical surface of the light-penetrating medium. The samples are adapted to be placed on the metal thin film. After the light beam enters the light-penetrating medium from a side away from the optical surface, the light beam is adapted to be totally internally reflected at the optical surface, such that surface plasmon resonance occurs at a surface of the metal thin film to excite the samples. The samples are adapted to emit signal light beams after being excited. The plurality of sensors are adapted to sense the signal light beams. The metal thin film is disposed between the plurality of sensors and the light-penetrating medium.

8 Claims, 4 Drawing Sheets

(51) Int. Cl.
    *H04N 5/369*     (2011.01)
    *H04N 9/04*     (2006.01)
    *G01N 21/64*     (2006.01)
    *G02B 5/22*     (2006.01)
    *G02B 5/28*     (2006.01)
    *H01L 31/112*     (2006.01)
    *G01N 21/552*     (2014.01)

(56) References Cited

U.S. PATENT DOCUMENTS

| | | | |
|---|---|---|---|
| 2009/0142847 A1* | 6/2009 | Geddes | G01N 21/6428 |
| | | | 436/63 |
| 2010/0256016 A1* | 10/2010 | Blair | B82Y 15/00 |
| | | | 506/13 |
| 2013/0050813 A1 | 2/2013 | Kim et al. | |
| 2014/0256593 A1* | 9/2014 | Szmacinski | C12Q 1/02 |
| | | | 506/9 |
| 2017/0362645 A1* | 12/2017 | Prins | C12Q 1/6825 |

* cited by examiner

SENSING APPARATUS

CROSS-REFERENCE TO RELATED APPLICATION

This application claims the priority benefit of U.S. provisional application Ser. No. 62/696,322, filed on Jul. 10, 2018. The entirety of the above-mentioned patent application is hereby incorporated by reference herein and made a part of this specification.

BACKGROUND OF THE INVENTION

Field of the Invention

The invention relates to a sensing apparatus.

Description of Related Art

An evanescent wave generated by total internal reflection may be used to excite biomolecules with fluorescent markers. At present, by fixing biomolecules with fluorescent markers on a waveguide layer and coupling an excitation light beam into the waveguide layer, the excitation light beam continuously undergoes total internal reflection in the waveguide layer to generate an evanescent wave to excite the biomolecules with fluorescent markers. However, since the light intensity of fluorescent signals is low, once there is a defect at the interface where total internal reflection occurs in the waveguide layer, stray light may be generated, thereby affecting the detection result of the fluorescent signals.

SUMMARY OF THE INVENTION

The invention provides a sensing apparatus with a high signal-to-noise ratio (SNR).

An embodiment of the invention provides a sensing apparatus adapted to detect samples. The sensing apparatus includes a light source, a light-penetrating medium, a metal thin film, a plurality of sensors, and an opaque layer. The light source is used to provide a light beam. The light-penetrating medium has an optical surface. The metal thin film is disposed on the optical surface of the light-penetrating medium. The samples are adapted to be placed on the metal thin film. After the light beam enters the light-penetrating medium from a side away from the optical surface, the light beam is adapted to be totally internally reflected at the optical surface, such that surface plasmon resonance (SPR) occurs at a surface of the metal thin film to excite the samples. The samples are adapted to emit signal light beams after being excited. The plurality of sensors are used to sense the signal light beams. The metal thin film is disposed between the plurality of sensors and the light-penetrating medium. The opaque layer is disposed on the optical surface of the light-penetrating medium, wherein the opaque layer has a plurality of holes, the metal thin film is disposed at least corresponding to the plurality of holes of the opaque layer, and positions of the plurality of sensors respectively correspond to positions of the plurality of holes.

In an embodiment of the invention, the metal thin film above is in physical contact with the light-penetrating medium.

In an embodiment of the invention, the metal thin film includes a plurality of metal patterns separated from each other, and the plurality of metal patterns are respectively disposed in the plurality of holes of the opaque layer and located at bottom portions of the holes.

In an embodiment of the invention, the metal thin film is disposed between the light-penetrating medium and the opaque layer, and the plurality of holes expose portions of the metal thin film.

In an embodiment of the invention, the samples are placed in the plurality of holes.

In an embodiment of the invention, the sensing apparatus further includes a substrate and a connecting unit. The plurality of sensors are disposed on the substrate. The connecting unit is connected between the substrate and the light-penetrating medium, and the connecting unit surrounds the metal thin film, wherein a space is formed between the substrate, the connecting unit, and the metal thin film.

In an embodiment of the invention, the connecting unit includes an inlet and an outlet, the inlet and the outlet communicate with the space, and the inlet and the outlet are respectively located at two opposite sides of the connecting unit.

In an embodiment of the invention, the sensing apparatus further includes a filter layer disposed between the metal thin film and the plurality of sensors, and the filter layer is disposed at least corresponding to the plurality of sensors.

Based on the above, in the sensing apparatus of an embodiment of the invention, since the metal thin film is disposed between the plurality of sensors and the light-penetrating medium, that is, the plurality of sensors are disposed at the opposite side of the light source, the plurality of sensors are less susceptible to light beams from the light source. Besides, by the configuration of the metal thin film, in addition to producing surface plasmon resonance at the surface of the metal thin film via total internal reflection to excite the samples, the metal thin film may also block stray light from passing through and affecting the detection results of the sensors. Therefore, the sensing apparatus in the embodiment of the invention may have a higher SNR.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
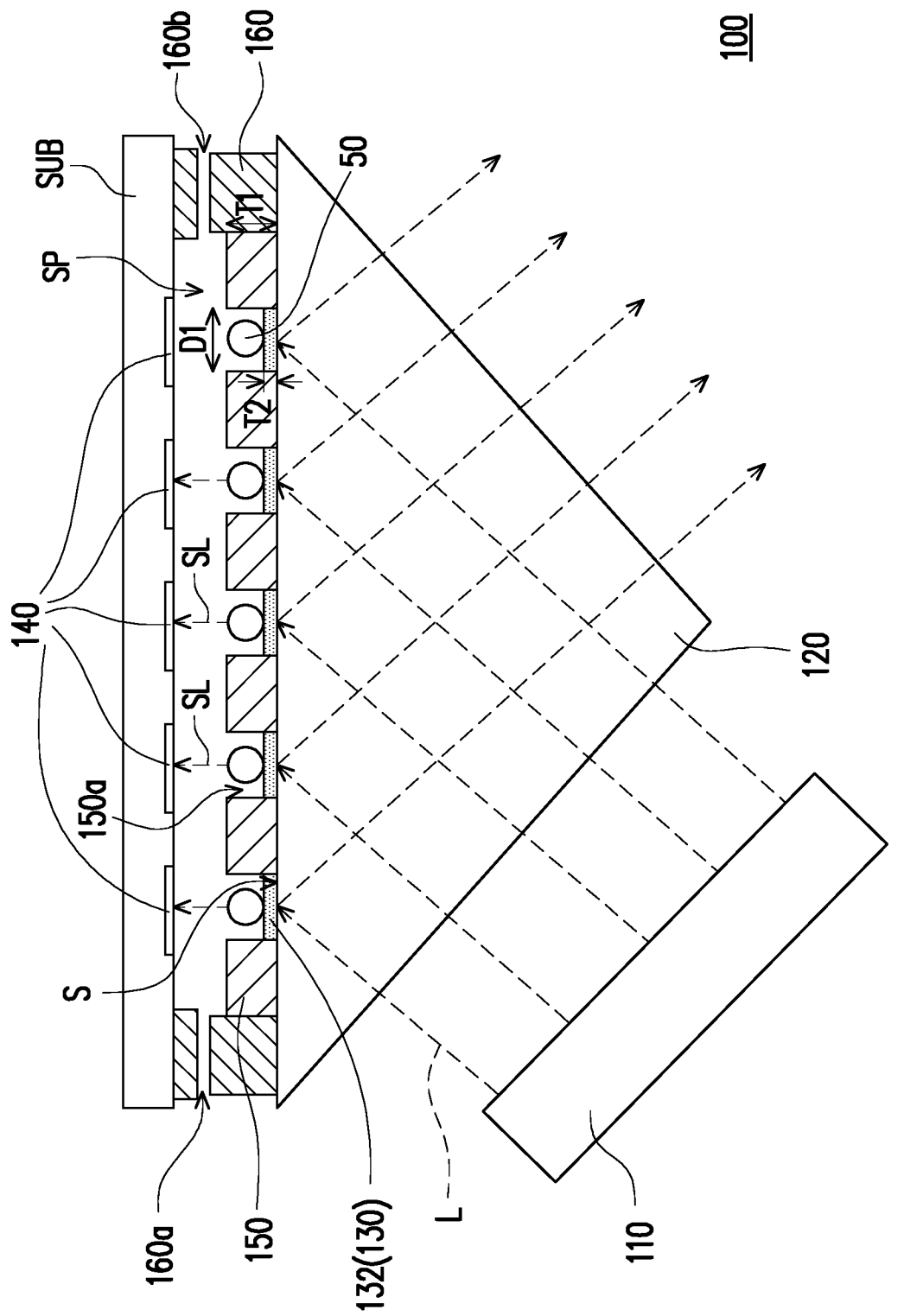
FIG. 1 is a schematic cross-sectional view of a sensing apparatus according to an embodiment of the invention.
Figure 2:
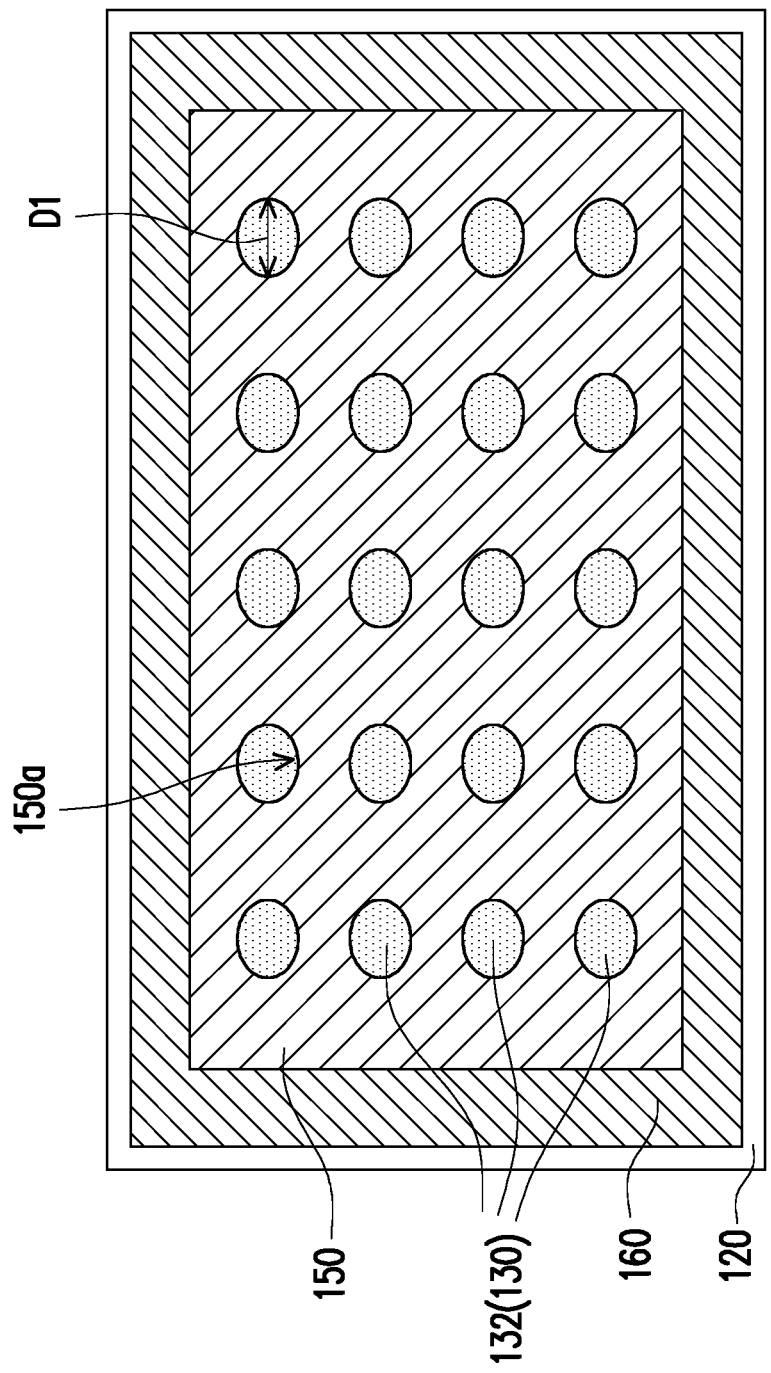
FIG. 2 is a schematic top view of the light-penetrating medium, the metal thin film, the opaque layer, and the connecting unit in FIG. 1.

FIG. 1 is a schematic cross-sectional view of a sensing apparatus according to an embodiment of the invention. FIG. 2 is a schematic top view of the light-penetrating medium, the metal thin film, the opaque layer, and the connecting unit in FIG. 1. In an embodiment of the invention, a sensing apparatus 100 is used to detect samples 50.

For example, the sensing apparatus 100 is used, for example, to determine gene sequencing, that is, to analyze the arrangement of bases of a particular DNA (deoxyribonucleic acid) fragment (i.e., arrangement of adenine (A), thymine (T), cytosine (C), and guanine (G)). The samples 50 include, for example, specific single-stranded DNA fragments, and the arrangement of the bases in the samples 50 is determined via combining reagents having different fluorescent labels with the samples 50, but the invention is not limited thereto. In other embodiments, the samples 50 may be other biomolecules with fluorescent markers, such as proteins or cells.

Referring first to FIG. 1, in an embodiment of the invention, the sensing apparatus 100 includes a light source 110, a light-penetrating medium 120, a metal thin film 130, and a plurality of sensors 140. The light source 110 is used to provide a light beam L. The light beam L is, for example, a transverse magnetic wave used to generate a surface plasmon resonance phenomenon. The light-penetrating medium 120 has an optical surface S. In the present embodiment, the light-penetrating medium 120 has a larger refractive index than the medium outside the optical surface S (for example, the medium in a space SP), so that the light beam L may be totally internally reflected at the optical surface S in the light-penetrating medium 120. For example, the light-penetrating medium 120 is, for example, a prism. In other embodiments, the light-penetrating medium 120 may be a slide glass or other suitable optically denser media (i.e. medium of higher refractive index). The metal thin film 130 is disposed on the optical surface S of the light-penetrating medium 120 and is in physical contact with the light-penetrating medium 120, and the samples 50 are adapted to be placed on the metal thin film 130. The material of the metal thin film 130 is, for example, gold (Au), silver (Ag), or other suitable metal materials. The plurality of sensors 140 are respectively disposed directly above the samples 50, and thus the plurality of sensors 140 respectively correspond to portions of the metal thin film 130 at which the samples 50 are disposed. The metal thin film 130 is disposed between the plurality of sensors 140 and the light-penetrating medium 120.

In the present embodiment, after the light beam L enters the light-penetrating medium 120 from a side away from the optical surface S, the light beam L is adapted to undergo total internal reflection at the optical surface S such that surface plasmon resonance occurs at the surface of the metal thin film 130 to excite the samples 50, and the samples 50 are adapted to emit a signal light beam SL after being excited.

In detail, in the present embodiment, after the light beam L enters the light-penetrating medium 120 from a side away from the optical surface S, since the light beam L is a polarized transverse magnetic wave, by appropriate angle adjustment and appropriate light wavelength conditions, the light beam L may be totally internally reflected at the optical surface S, and an evanescent wave is generated at a side outside the light-penetrating medium 120 close to the metal thin film 130. The evanescent wave may interact with the surface plasmon of the metal thin film 130 to produce surface plasmon resonance, so that the samples 50 on the metal thin film 130 are excited by the resonance energy to emit the signal light beam SL.

Moreover, the plurality of sensors 140 of the sensing apparatus 100 are adapted to sense the signal light beam SL and analyze the information of the samples 50 via a processor (not shown) of the sensing apparatus 100. In the present embodiment, the sensors 140 include, for example, charge-coupled devices (CCD), complementary metal-oxide-semiconductor (CMOS) sensors, or other suitable sensing devices.

In the present embodiment, since the metal thin film 130 is disposed between the plurality of sensors 140 and the light-penetrating medium 120, that is, the plurality of sensors 140 are disposed at an opposite side of the sensing apparatus 100 away from the light source 110, the plurality of sensors 140 are less susceptible to the light beam L from the light source 110. Besides, by the configuration of the metal thin film 130, in addition to producing surface plasmon resonance at the surface of the metal thin film 130 via total internal reflection to excite the samples 50, the metal thin film 130 may also block stray light from passing through and affecting the detection results of the sensors 140. Therefore, the sensing apparatus 100 in the embodiment of the invention may have a higher SNR.

Referring to both FIG. 1 and FIG. 2, in the present embodiment, the sensing apparatus 100 further includes an opaque layer 150 disposed on the optical surface S of the light-penetrating medium 120, and the opaque layer 150 has a plurality of holes 150a, and the metal thin film 130 is disposed at least corresponding to the plurality of holes 150a of the opaque layer 150. In the present embodiment, the plurality of holes 150a of the opaque layer 150 are a plurality of through-vias that penetrate through the opaque layer 150. In the present embodiment, the opaque layer 150 is, for example, an opaque metal (e.g., aluminum), an opaque insulating material (e.g., black glue), or other suitable opaque materials. In the present embodiment, the plurality of holes 150a of the opaque layer 150 are, for example, arranged in an array, and the top-view shape of the plurality of holes 150a is, for example, circular, but the invention is not limited thereto. In other embodiments, the plurality of holes 150a may be randomly arranged, or the top-view shape of the plurality of holes 150a may be rectangular or other shapes.

In the present embodiment, a width D1 (or diameter) of the holes 150a is, for example, 300 nm. A thickness T1 of the opaque layer 150 is, for example, greater than or equal to 350 nm. A thickness T2 of the metal thin film 130 is, for example, 50 nm, but the invention is not limited thereto.

Specifically, the metal thin film 130 of the present embodiment includes a plurality of metal patterns 132 separated from each other, and the plurality of metal patterns 132 are respectively disposed in the plurality of holes 150a of the opaque layer 150 and located at the bottom portions of the holes 150a. The samples 50 are adapted to be respectively placed on the plurality of metal patterns 132 in the holes 150a. In detail, the samples 50 may include a plurality of single-stranded DNA fragments, and the plurality of DNA fragments are respectively fixed on the metal patterns 132 in the respective holes 150a. In an embodiment, the samples 50 are, for example, placed directly in the holes 150a after being fixed to a carrier (e.g., a nano-bead). In another embodiment, the samples 50 may be fixed on the metal patterns 132 by means of polymerase immobilization, and the invention is not limited thereto.

By placing the opaque layer 150 in an area where the samples 50 are not placed, the passage of stray light may be further prevented, and the SNR of the sensing apparatus 100 may be improved.

Further, the positions of the plurality of sensors 140 of the present embodiment respectively correspond to the positions of the plurality of holes 150a. In other words, the positions of the plurality of sensors 140 respectively correspond to the positions of the samples 50 placed on the plurality of metal patterns 132, so as to facilitate the detection of the signal light beam SL emitted by the samples 50.

In the present embodiment, the sensing apparatus 100 further includes a substrate SUB and a connecting unit 160. The plurality of sensors 140 are disposed on the substrate SUB. The connecting unit 160 is connected between the substrate SUB and the light-penetrating medium 120, and the connecting unit 160 surrounds the metal thin film 130 and the opaque layer 150, wherein a space SP (labeled in FIG. 1) is formed between the substrate SUB, the connecting unit 160, the metal thin film 130, and the opaque layer 150. In the present embodiment, the connecting unit 160 is, for example, a ring-shaped plastic frame. The inside of the space SP is, for example, air or a liquid (for example, water), or any substance having a refractive index lower than that of the light-penetrating medium 120, and the invention is not limited thereto.

As shown in FIG. 1, in the present embodiment, the connecting unit 160 includes an inlet 160a and an outlet 160b, the inlet 160a and the outlet 160b communicate with the space SP, and the inlet 160a and the outlet 160b are respectively located at two opposite sides of the connecting unit 160. Specifically, in the present embodiment, the reagent used for the reaction may enter and exit the space SP via the inlet 160a and the outlet 160b to react with the samples 50.

Figure 3:
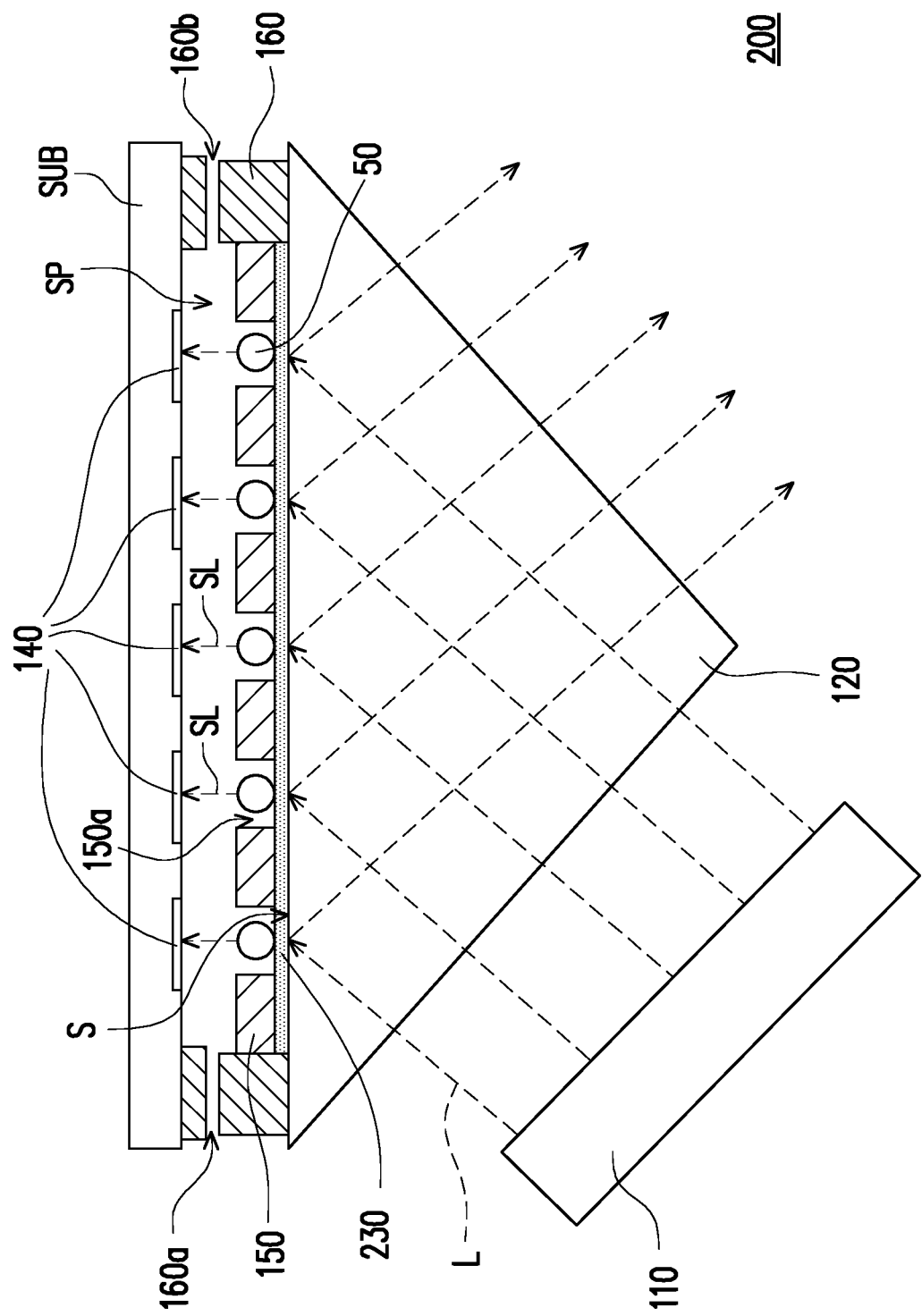
FIG. 3 is a schematic cross-sectional view of a sensing apparatus according to another embodiment of the invention.

FIG. 3 is a schematic cross-sectional view of a sensing apparatus according to another embodiment of the invention. Referring to FIG. 3, a sensing apparatus 200 of the present embodiment is substantially similar to the sensing apparatus 100 of FIG. 1. The components of the sensing apparatus 200 and related descriptions are as provided for the sensing apparatus 100 of FIG. 1, which are not repeated herein. The main difference is that a metal thin film 230 of the sensing apparatus 200 of the present embodiment is a film layer that is not patterned, and the metal thin film 230 is disposed between the light-penetrating medium 120 and the opaque layer 150, and the plurality of holes 150a expose portions of the metal thin film 230, wherein the samples 50 are placed on the metal thin film 230 in the holes 150a.

Figure 4:
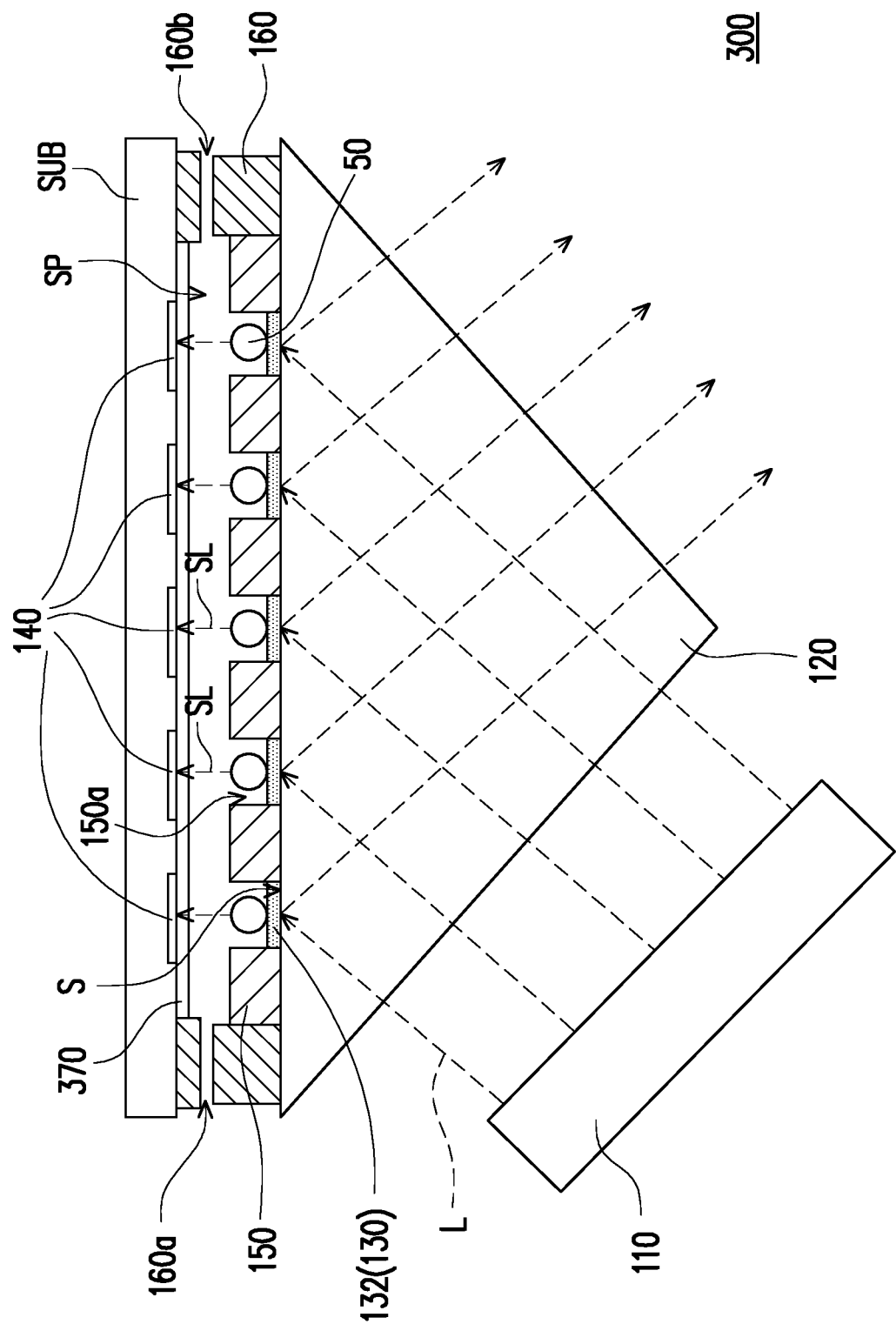
FIG. 4 is a schematic cross-sectional view of a sensing apparatus according to another embodiment of the invention.

FIG. 4 is a schematic cross-sectional view of a sensing apparatus according to another embodiment of the invention. Referring to FIG. 4, a sensing apparatus 300 of the present embodiment is substantially similar to the sensing apparatus 100 of FIG. 1. The components of the sensing apparatus 300 and related descriptions are as provided for the sensing apparatus 100 of FIG. 1, which are not repeated herein. The main difference is that the sensing apparatus 300 of the present embodiment further includes a filter layer 370 used to filter (e.g., absorb) stray light to prevent stray light from being transmitted to the plurality of sensors 140 and affecting the detection results, such that the SNR of the sensing apparatus 300 may be further improved. The filter layer 370 is disposed between the metal thin film 130 and the plurality of sensors 140 and is disposed at least corresponding to the plurality of sensors 140. In the present embodiment, the filter layer 370, for example, entirely covers one side of the substrate SP close to the plurality of sensors 140. In other embodiments, the filter layer 370 may be a plurality of separate filter units (not shown) and respectively correspond to the plurality of sensors 140.

Based on the above, in the sensing apparatus in an embodiment of the invention, since the metal thin film is disposed between the plurality of sensors and the light-penetrating medium, that is, the plurality of sensors are disposed at the opposite side of the light source, the plurality of sensors are less susceptible to light beams from the light source. Besides, by the configuration of the metal thin film, in addition to producing surface plasmon resonance at the surface of the metal thin film via total internal reflection to excite the samples, the metal thin film may also block stray light from passing through and affecting the detection results of the sensors. Therefore, the sensing apparatus in an embodiment of the invention may have a higher SNR. In addition, by placing the opaque layer in an area where the samples are not placed, the passage of stray light may be further prevented, and the SNR of the sensing apparatus may be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A sensing apparatus adapted to detect samples, the sensing apparatus comprising:
    a light source used to provide a light beam;
    a light-penetrating medium having an optical surface;
    a metal thin film disposed on the optical surface of the light-penetrating medium, the samples adapted to be placed on the metal thin film, wherein after the light beam enters the light-penetrating medium from a side away from the optical surface, the light beam is adapted to be totally internally reflected at the optical surface, such that a surface plasmon resonance occurs at a surface of the metal thin film to excite the samples, and the samples are adapted to emit signal light beams after being excited;
    a plurality of sensors used to sense the signal light beams, wherein the metal thin film is disposed between the plurality of sensors and the light-penetrating medium; and
    an opaque layer disposed on the optical surface of the light-penetrating medium, wherein the opaque layer has a plurality of holes, the metal thin film is disposed at least corresponding to the plurality of holes of the opaque layer, and a position of each of the plurality of sensors corresponds in a vertical direction to a position of each of the plurality of holes.

2. The sensing apparatus of claim 1, wherein the metal thin film is in physical contact with the light-penetrating medium.

3. The sensing apparatus of claim 1, wherein the metal thin film comprises a plurality of metal patterns separated from each other, and the plurality of metal patterns are respectively disposed in the plurality of holes of the opaque layer and located at bottom portions of the holes.

4. The sensing apparatus of claim 1, wherein the metal thin film is disposed between the light-penetrating medium and the opaque layer, and the plurality of holes expose portions of the metal thin film.

5. The sensing apparatus of claim 1, wherein the samples are placed in the plurality of holes.

6. The sensing apparatus of claim 1, further comprising:
    a substrate, wherein the plurality of sensors are disposed on the substrate; and
    a connecting unit connected between the substrate and the light-penetrating medium, and the connecting unit surrounding the metal thin film, wherein a space is formed between the substrate, the connecting unit, and the metal thin film.

7. The sensing apparatus of claim 6, wherein the connecting unit comprises an inlet and an outlet, the inlet and the outlet communicate with the space, and the inlet and the outlet are respectively located at two opposite sides of the connecting unit.

8. The sensing apparatus of claim 1, further comprising a filter layer disposed between the metal thin film and the plurality of sensors, and the filter layer is disposed at least corresponding to the plurality of sensors.

\* \* \* \* \*